United States Patent
Bikumala

(10) Patent No.: US 10,509,485 B2
(45) Date of Patent: Dec. 17, 2019

(54) LIGHT SENSITIVE KEYBOARD

(71) Applicant: Dell Products L. P., Round Rock, TX (US)

(72) Inventor: Sathish Kumar Bikumala, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 15/970,376

(22) Filed: May 3, 2018

(65) Prior Publication Data

US 2019/0339790 A1    Nov. 7, 2019

(51) Int. Cl.
*G06F 3/03* (2006.01)
*H01H 13/702* (2006.01)
*H03K 17/94* (2006.01)

(52) U.S. Cl.
CPC ......... *G06F 3/0325* (2013.01); *H01H 13/702* (2013.01); *H03K 17/943* (2013.01); *H03K 2217/94106* (2013.01)

(58) Field of Classification Search
CPC ........ G06F 3/0325; G06F 3/021; G06F 3/017; H01H 13/702; H01H 13/705; H01H 13/83; H01H 17/969; H03K 17/943
See application file for complete search history.

(56) References Cited

U.S. PATENT DOCUMENTS 5,317,145 A * 5/1994 Corio .................... G01S 3/7861
250/203.4
6,962,454 B1 * 11/2005 Costello ................ G06F 3/0202
400/692
2007/0165002 A1 * 7/2007 Wassingbo ............ G06F 3/0202
345/169
2009/0029329 A1    1/2009 Ackloo
2012/0161988 A1    6/2012 Chang (Continued)

OTHER PUBLICATIONS

Michaud, Robert J., U.S. Patent and Trademark Office, Non-Final Office Action dated Jun. 27, 2019 for U.S. Appl. No. 16/052,780, 42 pages.

*Primary Examiner* — Robert J Michaud
(74) *Attorney, Agent, or Firm* — Campbell Stephenson LLP; Shiv S. Naimpally

(57) ABSTRACT

A physical keyboard includes a plurality of light-sensing electrodes, where individual ones of the light-sensing electrodes of the plurality of light-sensing electrodes correspond to an individual key of the keyboard. The physical keyboard also includes a microprocessor electrically coupled to individual ones of the light-sensing electrodes. The microprocessor is configured to perform operations including determining that light is obstructed to a first particular light-sensing electrode of the plurality of light-sensing electrodes and sending a signal indicating a selection of a first key corresponding to the first particular light-sensing electrode. The microprocessor is configured to perform operations further comprising determining that the light is obstructed to a second particular light-sensing electrode, and sending a second signal indicating a second selection of a second key corresponding to the second particular light-sensing electrode. The microprocessor is configured to perform operations further comprising predicting a word based on the first and second key.

20 Claims, 4 Drawing Sheets

(56) References Cited

U.S. PATENT DOCUMENTS

| | | | |
|---|---|---|---|
| 2014/0071066 A1 | 3/2014 | Lee et al. | |
| 2015/0108903 A1* | 4/2015 | Sun | H05B 37/0218 |
| | | | 315/153 |
| 2019/0025939 A1* | 1/2019 | Patel | G06F 3/0237 |

* cited by examiner

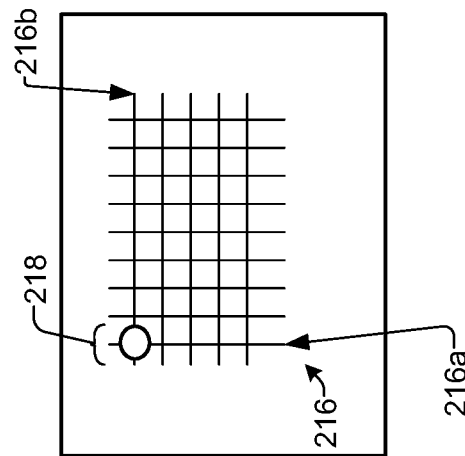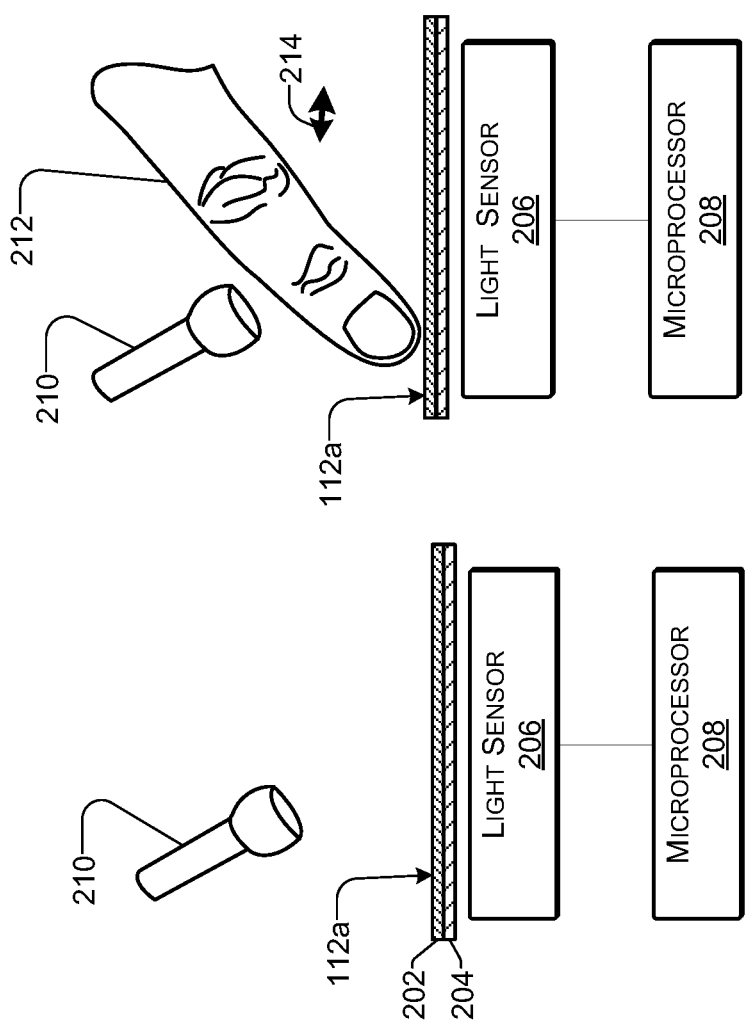

LIGHT SENSITIVE KEYBOARD

BACKGROUND OF THE INVENTION

Field of the Invention

This invention relates generally to computing devices and, more particularly a method for inputting text into the computing device.

Description of the Related Art

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Traditional electro-mechanical keyboards have been used to provide input to computing devices for decades. Each individual key is pressed, in turn, and the key presses are registered to spell words and create sentences, paragraphs, and the like. In an electro-mechanical keyboard, an underlying switching matrix registers a key press by detecting when the keyboard circuit, which is normally open, is closed by the key press. The switching matrix determines which key was pressed to temporarily close the circuit. Keyboard technology has not evolved significantly since early personal computers.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a physical keyboard may include a plurality of light-sensing electrodes, where individual ones of the light-sensing electrodes correspond to an individual key of the keyboard. A microprocessor coupled to the light-sensing electrodes may determine that light is obstructed (e.g., by an appendage, such as a finger, or by a stylus) to a first particular light-sensing electrode and send a signal indicating a selection of a first key corresponding to the first particular light-sensing electrode. The microprocessor may additionally determine that the light is obstructed to a second particular light-sensing electrode and send a signal indicating a second selection of a second key corresponding to the second particular light-sensing electrode. The microprocessor may predict a word based on the first key and the second key.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

FIG. 2 is a partial block diagram including FIGS. 2A, 2B, and 2C illustrating aspects of a keyboard according to some embodiments.

DETAILED DESCRIPTION

Figure 1:
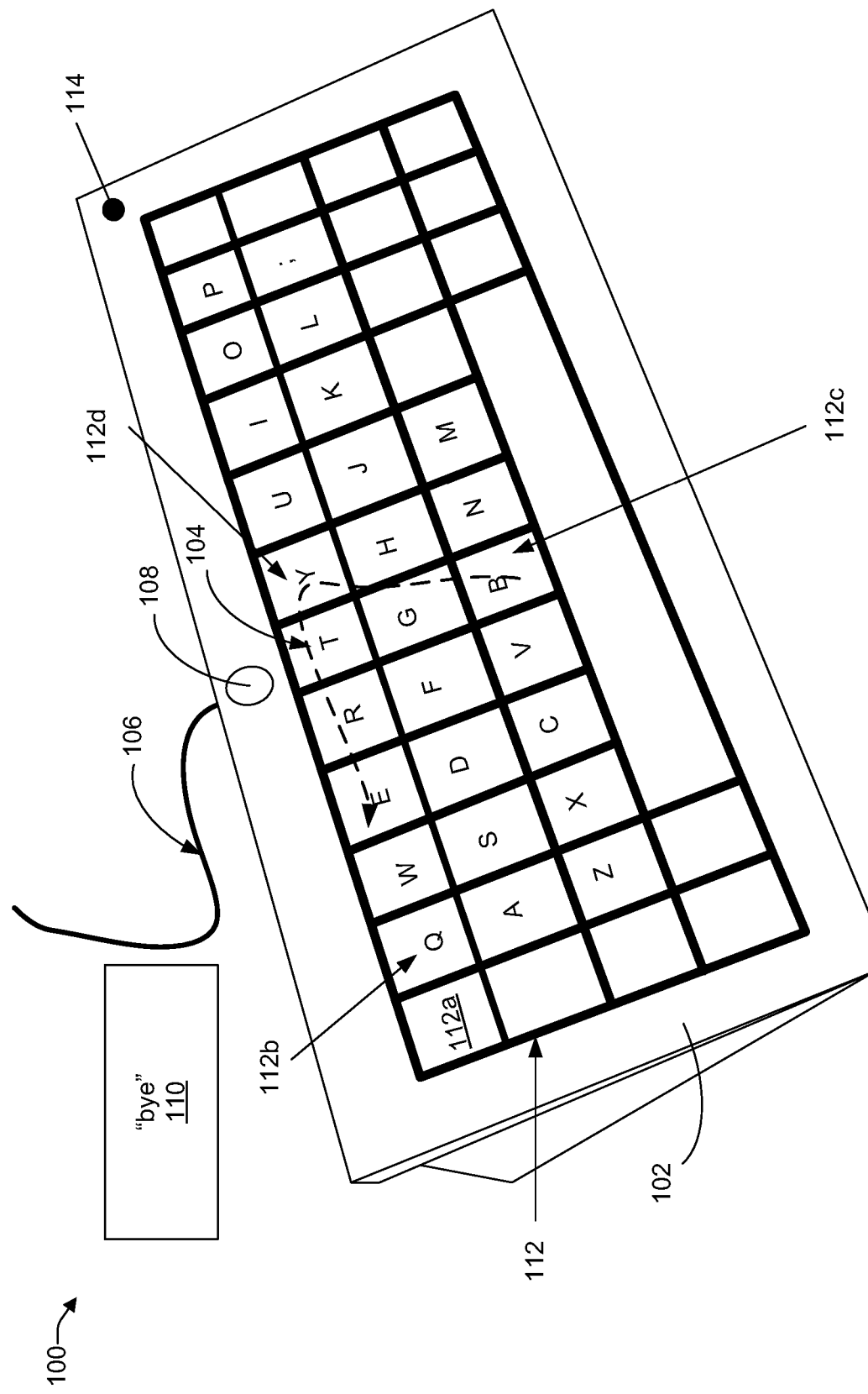
FIG. 1 is a diagram illustrating a keyboard according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein may enable a user using a physical keyboard, to provide input to a computing device faster. For example, a user may trace a pattern, without lifting a stylus or an appendage (e.g., a finger) off of the keyboard, such that the pattern touches several keys on the keyboard to enter characters. The term character refers to any symbol that may be entered using a keyboard, such as, for example, alphabetic characters, numeric characters, symbolic characters, functions keys, special purpose keys (e.g., control, alt, escape, backspace, delete, and the like). While examples of characters from a QWERTY-based English language keyboard are used herein, it should be understood that other characters for use in other languages (e.g., Hindi, Bengali, Urdu, Mandarin, Japanese, and the like) may be generated by keys on the keyboard.

In one example, a physical keyboard may have a light sensor installed underneath individual keys. The presence of ambient light on a particular key may signal to the keyboard that the particular key has not been selected. When the ambient light to the key is temporarily obstructed, the keyboard interprets the interruption of the light as a selection of the key. The ambient light to a key may be obstructed for example, by a user's appendage (e.g., finger or thumb) or a stylus. As a user does not press down on a key to indicate selection, but rather obstructs ambient light to the key, the user may move fingers along a horizontal plane around the keyboard to enter input. For example, a user may use motions such as swiping or sliding the keys of the keyboard to enter input.

To illustrate, the user may move a finger or a stylus across the surface of the keyboard without lifting the finger or the stylus off of the surface of the keyboard. The motion of the finger or stylus may thus be continuous, with the finger or stylus continuously in contact with the surface of the keyboard. A "key press" may occur when the light to a particular key is blocked for more than a predetermined amount of time (e.g., between about 100 to 300 milliseconds (ms)) to enable the keyboard to distinguish a key press from when the stylus or finger is merely passing over a particular key. In some cases, the predetermined amount of time (e.g., time interval) used to determine whether a key press occurred may be user definable and may be stored in a user profile. For example, a first user may have a first profile that specifies that a key press is between about 100 to 200 ms while a second user may have a second profile that specifies that a key press is between about 200 to 400 ms.

As a first example, a physical keyboard may include a plurality of light-sensing electrodes, where individual ones of the light-sensing electrodes of the plurality of light-sensing electrodes correspond to an individual key of the keyboard. For example, the keyboard may have a light-sensing electrode under each of the keys. The physical keyboard also includes a microprocessor electrically coupled to individual ones of the light-sensing electrodes.

In a second example, a computing device may include a housing that includes one or more processors, one or more non-transitory computer-readable storage media, and a keyboard. For example, the computing device may be a smart phone with a physical keyboard. In a third example, a computing device may include a housing that includes one or more processors and one or more non-transitory computer-readable storage media. The computing device may also include a keyboard communicatively coupled to the housing, where the keyboard is coupled through a wired or wireless connection. For example, the computing device may be a desktop computer with either a wireless keyboard or a keyboard connected through a Universal Serial Bus (USB) connection.

In all three examples, the microprocessor may determine that light is obstructed to a first particular light-sensing electrode of the plurality of light-sensing electrodes. For example, when a finger of a user is placed on or above a particular key for at least a predetermined amount of time, light to the key is obstructed. In responses, the microprocessor may send a signal indicating a selection of the particular key corresponding to the first particular light-sensing electrode.

The microprocessor may determine that the light is obstructed to a second particular light-sensing electrode of the plurality of light-sensing electrodes for at least the predetermined amount of time. For example, the user may place his finger above or on a second key for at least the predetermined amount of time. In response, the microprocessor may send a second signal indicating a second selection of a second key corresponding to the second particular light-sensing electrode.

In some cases, after indicating the selection of a first key, the microprocessor may predict a word based on each subsequent key selection. For example, the microprocessor may (i) predict a first word after detecting a first key selection, (ii) predict a second word (which may be the same or different from the first word) after detecting a second key selection, (iii) predict a third word (which may be the same or different from the first word and second word) after detecting a third key selection, and so on.

Because the keyboard uses the blocking of ambient light to detect a key press, the keyboard may include one or more lights (e.g., light emitting diodes (LEDs) or the like) that are activated when one or more ambient light sensors (ALS) determine that the ambient light is less than a threshold amount. For example, the microprocessor may receive data from at least one ambient light sensor and determine, based on the data, that an amount of ambient light falling on the keyboard is less than a predetermined threshold. This may occur, for example, when the keyboard is located in a dark room or at night. In response to detecting that the amount of ambient light is less than the predetermined threshold, the microprocessor may provide power to one or more light emitting diodes (or other light sources) to illuminate the physical keyboard. For example, the light sources may be located at the top of the keyboard facing down, on the bottom of the keyboard facing up, on either side of the keyboard facing in, or located on one end of a small adjustable shaft (e.g., a gooseneck) that the user can position to shine light on to the keyboard.

FIG. 1 is a diagram illustrating an environment 100 that includes a keyboard 102 that may be connected or coupled to a computing device, according to some embodiments. Keyboard 102 may use an arrangement of buttons or keys that may be referred to as a layer of keys 112. The layer of keys 112 serves as an interface between a user and a computing device. Keyboard 102 may be a physical keyboard used to provide input (e.g., letters, numbers, signs, etc.) to a computing device.

Keyboard 102 may be any size, of any flexibility, and contain any number of keys. One or more keys (e.g., key 112a, key 112b, etc.) may be any size and spaced apart by any amount of distance. Further, keyboard 102 is illustrative of one arrangement of the keys, any arrangement or layout of the keys may be used to implement keyboard 102. For example, keyboard 102 may be a standard alphanumeric keyboard, laptop-sized keyboards used on laptops and notebook computers, flexible keyboards, handheld ergonomic keyboards, thumb-sized keyboards, multifunctional, etc.

The keyboard may support alphanumeric characters used in any language (e.g., English, Hindi, Bengali, Urdu, Mandarin, Japanese, etc.). The term character refers to any symbol that may be entered using a keyboard, such as for example, alphabetic characters, numeric characters, symbolic characters, functions keys, special purpose keys (e.g., control, alt, escape, backspace, delete, etc.) While examples of characters from a QWERTY-based ENGLIGH language keyboard are used herein, characters for use in other languages (e.g., Hindi, Bengali, Urdu, Mandarin, Japanese, and the like) may be generated by keys on the keyboard.

The layer of keys 112 may include a transparent membrane overlaid on multiple key caps. In some embodiments, the layer of keys 112 may include a transparent membrane, where characters are printed onto the transparent membrane.

The printed characters may overlay on respective key caps. The keys of keyboard 102 may be sealed inside the membrane to prevent moisture or particulate matter from entering into the physical keyboard.

Individual light-sensing electrodes may be present under each of the keys (e.g., key 112a, key 112b, etc.). Individual light-sensing electrodes may include a photoconductive material over a top surface of the electrodes. Individual light-sensing electrodes may react to light falling on its respective photoconductive material. That is, a light-sensing electrode may measure the amount of light falling on it, or alternatively measure the amount of darkness.

The light-sensing electrode generates an output signal indicating the intensity of light by measuring a radiant energy present at the light-sensing electrode. A light-sensing electrode may be able to measure an amount of luminous flux on the light-sensing electrode to several degrees of accuracy. For example, the light-sensing electrode may have a resistance range of 200 kilohms (KΩ) to 10 KΩ, where 200 KΩ corresponds to darkness and 10 KΩ corresponds to 10 lux (e.g., brightness). Accordingly, the light-sensing electrode is very sensitive to light.

One or more sources of light may be placed along the periphery of the layer of keys 112, such as, for example, a representative light emitting diode (LED) 108. Of course, other light sources may be used instead of an LED, such as an organic LED (OLED), or the like. A controller, such as a microprocessor of a computing device, or a microprocessor of keyboard 102, may provide power to light emitting diode 108. For example, the keyboard may be battery powered or powered via a universal serial bus (USB) connection. In response to receiving power, light emitting diode 108 may be positioned such that light is directed on the layer of keys 112.

The placement and shape of light emitting diode 108 are shown for illustrative purposes only. Any arrangement, shape, and number of light emitting diodes may be placed around the layer of key 112, in such a manner that a predetermined minimum amount of lux is present on layer of keys 112. For example, the light emitting diode may be include a strip of light, or multiple light emitting diodes placed in rows or columns around the layer of keys 112. The light sources may be located at the top of the keyboard facing down, on the bottom of the keyboard facing up, on either side of the keyboard facing in, or located on one end of a small adjustable shaft (e.g., a gooseneck) that the user can position to shine light on to the keyboard.

For example, sensors on keyboard 102 (e.g., ambient light sensor 114) may detect an amount of ambient light on the layer of keys 112. In one example, one or more light sensing electrodes may provide data corresponding to an amount of ambient light on the layer of keys 112. A microprocessor of the keyboard may receive data from the ambient light sensor 114, and determine that the amount of ambient light falling on the keyboard is less than a predetermined threshold. This may occur when a user uses keyboard 102 in a dark room, or at night. The microprocessor of the keyboard may provide power to the light emitting diode 108 to illuminate keyboard 102.

In various embodiments, keyboard 102 may register a selection of a key when light (e.g., ambient light, lights from light emitting diode 108, etc.) is obstructed on the particular key for a predetermined amount of time (e.g., between about 100 and 400 ms). In contrast, a conventional keyboard may register a selection of a key when a circuit corresponding to the particular key is closed, and current flows through the circuit corresponding to the particular key. In such conventional keyboards, in an unused state, the circuits under each key remains open until a key is pressed. The action of pressing the key results in closing a circuit under the key, and a microprocessor may determine that the key has been selected.

Keyboard 102, registers a selection of a key when light on a particular key is less than a predetermined amount for a predetermined amount of time. That is, when light is present on layer of keys 112, the circuit may be considered "closed" and when a stylus or appendage interrupts the light, the circuit may be considered "open". Thus, in an unused or first state of the keyboard, one or more closed circuits may be formed in response to light being present at individual keys (e.g., key 112a, 112b, etc.) of keyboard 102. A user selects a key by obstructing light to the particular key, which results in the keyboard transitioning from the first state to a second state in which an open circuit is formed at the particular key. In response to detecting the open circuit, a microprocessor may determine that the key has been selected.

Keyboard 102 may be included in a housing of a computing device, where the housing includes one or more processors, one or more non-transitory computer-readable storage media, and keyboard 102. For example, keyboard 102 may be a physical keyboard on a smartphone. Keyboard 102 may also be present outside of a housing of a computing device and communicatively coupled to the housing of the computing device. For example, keyboard 102 may be communicatively coupled to a computing device by way of a wire 106 (e.g., wired USB connection). Keyboard 102 may also be communicatively coupled to a computing device by way of a wireless connection (e.g., using radio frequency (RF), infrared (IR), Bluetooth®, or similar technologies).

In one example, a user enters text "bye" 110 by swiping or sliding an opaque object along path 104. The opaque object may include an appendage (e.g., a finger), a stylus, etc. In this example, prior to sliding the opaque object, a microprocessor of keyboard 102 may check that a sufficient amount of light is present on layer of keys 112. If an insufficient amount of light is detected, the microprocessor may power light emitting diode 108. Thus, prior to sliding the opaque object, keyboard 102 may be in a first or unused state where light shines on all the keys, and all circuits are closed.

Path 104 starts on key 112c (labeled "B"). As the opaque object is placed on or above key 112c, ambient light or light from light emitting diode 108 is obstructed. That is, a respective light-sensing electrode present under key 112c may detect a decrease in light. A microprocessor of keyboard 102 may receive a signal (e.g., an electric pulse) from the light-sensing electrode under key 112c and determine that light is obstructed to that light-sensing electrode, and further determine that a user has selected key 112c. In some embodiments, the microprocessor may compare the location of the light-sensing electrode on a key matrix to a character map to determine that "B" has been selected. The microprocessor may send a signal indicating a selection of "B" (e.g., to a microprocessor of a computing device).

Following path 104, the user may slide the opaque object to key 112d, where a respective light-sensing electrode present under key 112d detects a decrease in light. The microprocessor of keyboard 102 may receive a signal from the light-sensing electrode under key 112d and determine that light is obstructed to the light-sensing electrode, and further determine that a user has selected key 112d. The microprocessor may compare the location of the light-sensing electrode on a key matrix to a character map and determine that "Y" has been selected.

The microprocessor of keyboard 102 (or a microprocessor of the computing device) may predict a word based on an input of one or two characters or predict a word based on each subsequent key selection following the first selection. For example, the microprocessor of keyboard 102 may (i) predict a first word after detecting selection of key 112(c), (ii) predict a second word (which may be the same or different from the first word) after path 104 reaches key 112d, (iii) predict a third word (which may be the same or different from the first word and second word) after detecting a third key selection ("E" in path 104), etc. The microprocessor may use a word prediction algorithm to predict words based on a few letters input by a user. The microprocessor may also use algorithms that determine that a word is the start of a new sentence and automatically capitalize the first letter of the word.

Aside from character inputs, keyboard 102 may also accept gesture inputs such as pinch, zoom, and other gestures. For example, keyboard 102 may accept a pinch gesture to indicate a "left-click" mouse selection. The gesture inputs may be entered on a trackpad or on keyboard 102. In some example, a user may enable a gesture mode of keyboard 102 to input gestures and enable keyboard mode to select keys. In other examples, keyboard 102 may detect that a user has selected two or more keys simultaneously and determine that a user is entering a gesture.

In some cases, the type of gesture input (e.g., pinch, zoom, etc.) may be correlated to respective inputs (e.g., "left-click" on a mouse, "right-click" on a mouse, change zoom level of a window, etc.) and the correlations may be user definable and stored in a user profile. For example, a first user may have a first profile that specifies a pinch gesture indicates a "left-click" mouse selection while a second user may have a second profile that specifies a zoom gesture indicates a "left-click" mouse selection.

Thus, a user may enter input in to a keyboard including a layer of keys, by obstructing light to one or more keys of the keyboard. The keyboard detects a selection of a key by receiving input from a light-sensing electrode corresponding to the key. The user may slide an opaque object along the layer of keys to enter input, and the keyboard may predict a word based on one or more initial letters selected by the user. The keyboard may be used in environments in which there is plenty of ambient light as well as environments with little or no ambient light.

The speed at which a user may enter input into a physical keyboard may be increased as a user is not restricted to mechanically actuating a key by depressing each individual key. Instead, the user may slide an opaque object around the layer of keys to enter input. Thus, the physical keyboard supports gestures, sliding, and other movements along a horizontal plane of the keyboard. In addition, the use of the membrane on top of the keys to prevent moisture, particular matter, and the like from entering into the keyboard enables the keyboard to be used in environments where conventional keyboards would become damaged. For example, the keyboard described herein may be used in an industrial environment or even outdoors where moisture and/or particulate matter are present and may clog up a conventional mechanical keyboard.

FIG. 2 includes diagrams FIG. 2A, FIG. 2B, and FIG. 2C illustrating aspects of keyboard 102 according to some embodiments. In FIG. 2A a cross section of keyboard 102, and key 112a is illustrated. Key 112a may include a transparent membrane 202 and one or more additional layers 204 that may include the surface on which a label for key 112a is printed. In other embodiments, a label for key 112a may be printed directly on transparent membrane 202. Transparent membrane 202 may be membrane that is not touch-enabled and may prevent moisture or particular matter from entering into keyboard 102. For example, transparent membrane 202 may be composed of glass, silicone, plastic, or other polymers, etc.

Disposed beneath key 112a, is an ambient light sensor 206, which may be a light-sensing electrode as discussed above in FIG. 1. Light sensor 206 may be electrically coupled to a microprocessor 208 of the keyboard. Light sensor 206 may be any type of sensor of electromagnetic radiation, where the light sensor 206 may detect various frequencies including visible light, ultraviolet, infrared, etc. Light sensor 206 may include detectors of various mechanisms including photoconductive, photoemission, semiconductor, photovoltaic, thermal, etc.

For example, light sensor 206 may be a photoconductive device where light sensor 206 varies its resistance when exposed to light. In this example, light sensor 206 may include a photoconductive material (e.g. Cadmium Sulphide) on a top surface of light sensor 206, with two electrodes electrically connected to the photoconductive material. In turn, respective wire terminals may be coupled to each electrode. A current may flow through light sensor 206 based on the amount of light on light sensor 206, where the photoconductive material controls a flow of current. The photoconductive material may have less resistance the more light that it is exposed to. Thus, as light 210 is increased to light sensor 206, the more current that may flow through light sensor 206. In this example, light sensor 208 may have a length around 4.46 millimeters (mm) or 0.18 inches, a width of around 5 mm or 0.20 inches, a height of around 2.09 mm or 0.08 inches, and weigh around 0.25 grams or 0.01 ounces.

Microprocessor 208 may interface keyboard 208 to a computing device or a processor of the computing device. Microprocessor 208 may perform tasks such as informing a computing device when a key is selected, predicting words, and controlling light to layer of keys 112. In some embodiments, microprocessor 208 may be a keyboard controller, keyboard microchip, etc. In FIG. 2A light 210 represents ambient light that may fall on key 112a, for example from sunlight, light in a room, etc. Light 210 may also represent light from light emitting diode 108 (FIG. 1).

Layers 202 and 204 are transparent to enable light 210 to pass through and be detected by light sensor 206. When light reaches light sensor 206, key 112a may be in a first state (e.g., closed circuit as light 210 reaches light sensor 206). In FIG. 2B, a user may use an opaque object such as finger 212 to select key 112a. As finger 212 is opaque, light 210 is obstructed from reaching light sensor 206. Light sensor 206 detects the decrease in light 210 and sends a signal (e.g., an electric pulse) to microprocessor 208.

In FIG. 2B, key 112a may be in a second state (e.g., open circuit as light 210 is obstructed from reaching light sensor 206). Positioning the finger 212 at a location between light 210 and light sensor 206 for more than a predetermine amount of time (e.g., between about 100 to 300 ms) is sufficient to trigger a signal to microprocessor 208. The user may slide finger 212 in a direction 214 parallel to the surface of key 112a to select another key. Thus, the motion of finger 212 may be continuous, with finger 212 continuously in contact with membrane 202. A "key press" or key selection occurs when light 210 to key 112a is blocked from more than a predetermine amount of time to enable the keyboard to distinguish a key selection from when finger 212 is merely passing over key 112a.

In some embodiments, light sensor 206 may be mapped to a key matrix 216, where each light sensor 206 is electrically connected by a grid of wires (e.g., 216a, 216b, etc.). An intersection of the grid of wires may correspond to a particular light sensor 206. For example, intersection 218 may correspond to light sensor 206. Microprocessor 208 may scan columns (e.g., column 216a) of matrix 216. If a light sensor 206 detects light being obstructed to its respective key (i.e., a user has selected key 112a), the microprocessor 208 may scan the rows (e.g., row 216b) and determine a row-column combination at which a key has been selected. The microprocessor may translate the key selected into an alphanumeric character.

Thus, a user may enter input in to a keyboard including a layer of keys, by obstructing light to one or more keys of the keyboard. The keyboard detects a selection of a key by receiving input from a light-sensing electrode corresponding to the key. The user may slide an opaque object along the layer of keys to enter input, and the keyboard may predict a word based on one or more initial letters selected by the user. The keyboard may be used in environments in which there is plenty of ambient light as well as environments with little or no ambient light.

The speed at which a user may enter input into a physical keyboard may be increased as a user is not restricted to mechanically actuating a key by depressing each individual key. Instead, the user may slide an opaque object around the layer of keys to enter input. Thus, the physical keyboard supports gestures, sliding, and other movements along a horizontal plane of the keyboard. In addition, the use of the membrane on top of the keys to prevent moisture, particular matter, and the like from entering into the keyboard enables the keyboard to be used in environments where conventional keyboards would become damaged. For example, the keyboard described herein may be used in an industrial environment or even outdoors where moisture and/or particulate matter are present and may clog up a conventional mechanical keyboard.

Figure 3:
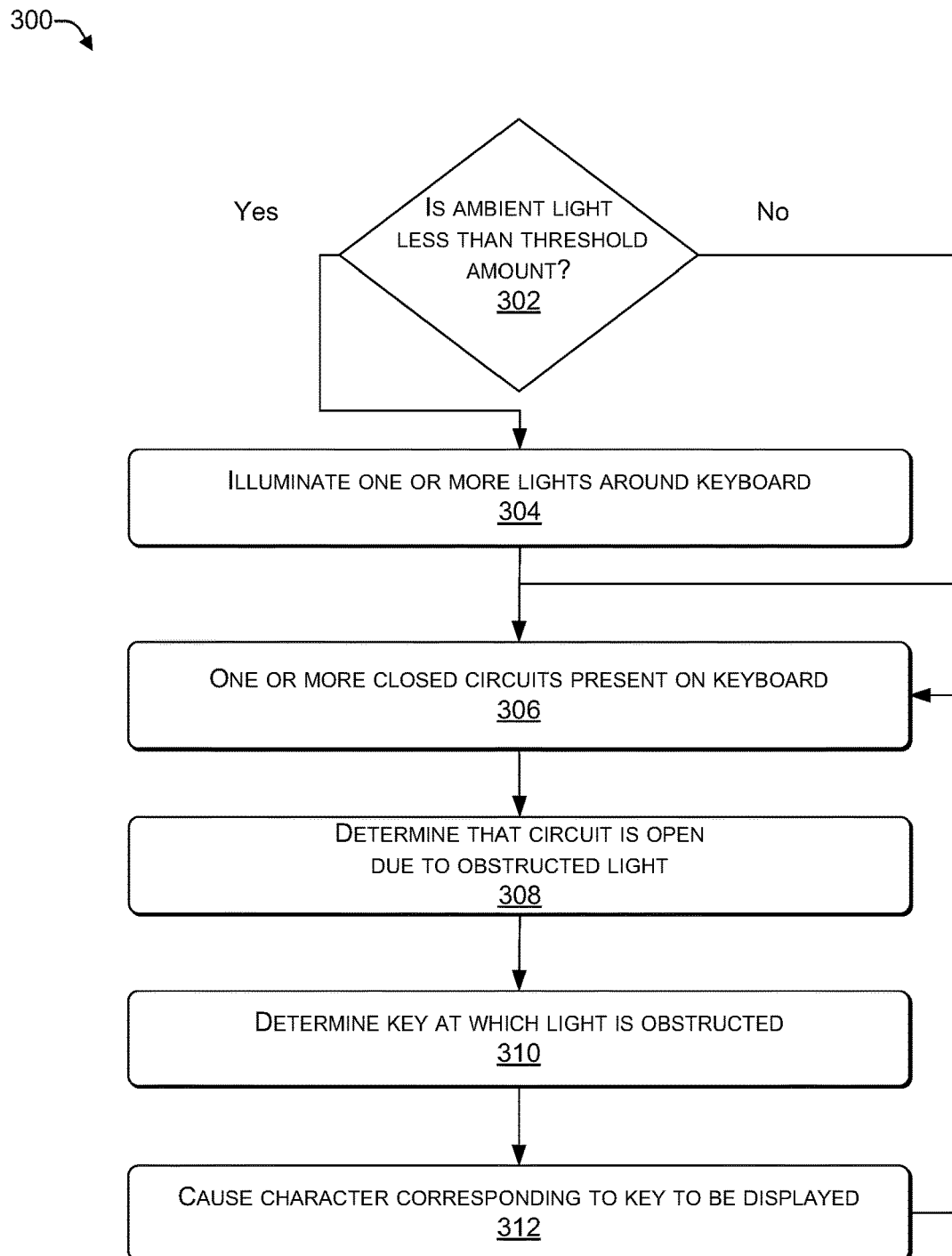
FIG. 3 is a flowchart of a process that includes inputting text from a keyboard according to some embodiments.

FIG. 3 is a flowchart of a process 300 that includes operating a keyboard as described herein. In the flow diagram of FIG. 3, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structure, and the like that perform particular functions or implement particular abstract data types. The order in which the block are described is not intended to be construed as a limitation, and any number of the described operations can be combined in any order and/or in parallel to implement the processes. For discussion purposes, the process 300 is described with reference to FIG. 1 and FIG. 2, as described above, although other models, frameworks, systems and environments may be used to implement this process.

The process 300 may be performed by a microprocessor 208 (FIG. 2). At decision block 302, a determination is made as to whether ambient light is less than a threshold amount. For example, an ambient light sensor of keyboard 102 may detect whether keyboard 102 is in a dark room or dark environment. If yes, the flow proceeds to block 304 where one or more lights around the keyboard are illuminated. For example, microprocessor 208 may cause power to be applied to light emitting diode 108. If no, the flow proceeds to block 306.

At block 306, light is present on the keyboard, and accordingly, one or more closed circuits are present on the keyboard. At block 308, a determination is made that a circuit is open due to obstructed light for more than a predetermined amount of time (e.g., between about 100 to 300 ms) to enable the keyboard to distinguish a key press from when a stylus of finger is merely passing over a particular key. For example, a finger 212 may obstruct light 210 from reaching light sensor 206 for more than a predetermined amount of time. At block 310, a determination is made of the key where the light is obstructed. For example, microprocessor 208 may determine, based on key matrix 216, that light is obstructed at key 112a. At block 312, a character corresponding to the key may be displayed. For example, microprocessor 208 may cause a character corresponding to key 112a to be displayed on a display of a computing device electrically coupled to the keyboard.

Thus, a user may enter input in to a keyboard including a layer of keys, by obstructing light to one or more keys of the keyboard. The keyboard detects a selection of a key by receiving input from a light-sensing electrode corresponding to the key. The user may slide an opaque object along the layer of keys to enter input, and the keyboard may predict a word based on one or more initial letters selected by the user. The keyboard may be used in environments in which there is plenty of ambient light as well as environments with little or no ambient light.

The speed at which a user may enter input into a physical keyboard may be increased as a user is not restricted to mechanically actuating a key by depressing each individual key. Instead, the user may slide an opaque object around the layer of keys to enter input. Thus, the physical keyboard supports gestures, sliding, and other movements along a horizontal plane of the keyboard. In addition, the use of the membrane on top of the keys to prevent moisture, particular matter, and the like from entering into the keyboard enables the keyboard to be used in environments where conventional keyboards would become damaged. For example, the keyboard described herein may be used in an industrial environment or even outdoors where moisture and/or particulate matter are present and may clog up a conventional mechanical keyboard.

Figure 4:
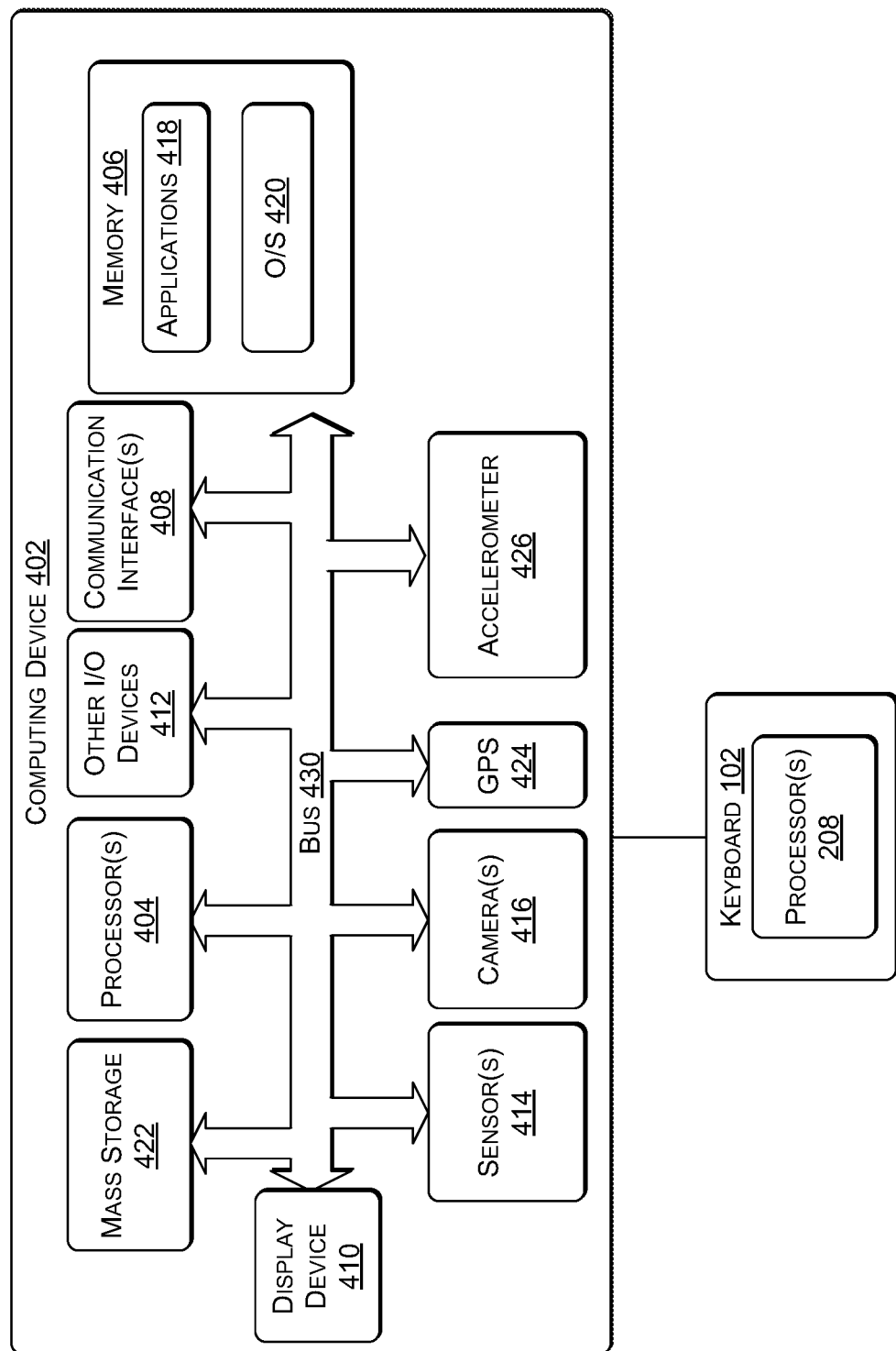
FIG. 4 illustrates an example configuration of a computing device that can be used to implement the systems and techniques described herein.

FIG. 4 illustrates an example configuration of a user device 400 that can be used to implement the systems and techniques described herein, such as for example, a computing device 402 electrically coupled to keyboard 102 of FIG. 1. The computing device 402 may include one or more processors 404 (e.g., CPU, GPU, or the like), a memory 406, communication interfaces 408, a display device 410, one or more mass storage devices 422, other input/output (I/O) devices 412 (e.g., headphones, trackball, and the like), one or more sensor(s) 414, one or more camera(s) 416, a Global Positioning System (GPS) 424, and accelerometer 426, configured to communicate with each other, such as via one or more system buses 430 or other suitable connections. While a single system bus 430 is illustrated for ease of understanding, it should be understood that the system buses 430 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 404 are one or more hardware devices that may include a single processing unit or a number of processing units, all of which may include single or multiple computing units or multiple cores. The processors 404 may include a graphics processing unit (GPU) that is integrated into the CPU or the GPU may be a separate processor device from the CPU. The processors 404 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 404 may be configured to fetch and execute computer-readable instructions stored in the memory 406, mass storage device 422, or other computer-readable media.

Memory 406 and mass storage device 422 are examples of computer storage media (e.g., memory storage devices) for storing instructions that can be executed by the processors 404 to perform the various functions described herein. For example, memory 406 may include both volatile memory and non-volatile memory (e.g., RAM, ROM, or the like) devices. Further, mass storage devices 422 may include hard disk drives, solid-state drives, removable media, including external and removable drives, memory cards, flash memory, floppy disks, optical disks (e.g., CD, DVD), a storage array, a network attached storage, a storage area network, or the like. Both memory 406 and mass storage devices 422 may be collectively referred to as memory or computer storage media herein and may be any type of non-transitory media capable of storing computer-readable, processor-executable program instructions as computer program code that can be executed by the processors 404 as a particular machine configured for carrying out the operations and functions described in the implementations herein.

The computing device 402 may include one or more communication interfaces 408 for exchanging data. The communication interfaces 408 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 408 can also provide communication with external storage, such as a storage array, network attached storage, storage area network, cloud storage, or the like.

The display device 410 may be used for displaying content (e.g., information and images) to users. Other I/O devices 412 may be devices that receive various inputs from a user and provide various outputs to the user, and may include a keyboard, a touchpad, a mouse, a printer, audio input/output devices, and so forth.

The sensor(s) 414 may include touch, proximity, light, heart rate, and pressure sensors. Camera(s) 416 may include complimentary metal-oxide-semiconductor (CMOS) image sensors, backside illuminated CMOS, or similar types of image sensors to capture images. GPS 424 may include a receiver that may receive geolocation and time information anywhere on Earth that has access to four or more GPS satellites. The GPS 424 may not transmit data and may operate independently of any telephonic or internet reception. Accelerometer 426 includes a device that measures the acceleration of the computing device 402 in its own instantaneous rest frame. Accelerometer 426 may play a part in a navigation system of the computing device 402.

The computer storage media, such as memory 406 and mass storage devices 422, may be used to store software and data. For example, the computer storage media may be used to store applications 418 and operating system (O/S) 420. O/S 520 manages computer hardware and software resources in computing device 402.

The computing device 402 may be communicatively coupled to keyboard 102. In one example, computing device 402 may be in a housing. The housing may include one or more processors 404, one or more non-transitory computer-readable storage media (e.g., memory 406), and keyboard 102. For example, computing device 402 may be a smart phone. In another example, the housing may include one or more processors 404 and one or more non-transitory computer-readable storage media (e.g., memory 406). The keyboard may be communicatively coupled to the housing. For example, computing device 402 may be a desktop computer where keyboard 102 is connected by a USB connection to computing device 402.

Keyboard 102 may include one or more processors 208. The one or more processors 208 may be a keyboard controller or a microchip. The processor 208 may execute code or operations including determining whether to provide power to one or more light-emitting diodes to illuminate a keyboard. For example, in a dark environment, processor 208 may provide power to light emitting diode 108 to provide light to the keys on keyboard 102. The processor 208 may execute code or operations including word prediction algorithms. Thus processor 208 may predict words as letters are entered into keyboard 102.

Thus, a user may enter input in to a keyboard including a layer of keys, by obstructing light to one or more keys of the keyboard. The keyboard detects a selection of a key by receiving input from a light-sensing electrode corresponding to the key. The user may slide an opaque object along the layer of keys to enter input, and the keyboard may predict a word based on one or more initial letters selected by the user. The keyboard may be used in environments in which there is plenty of ambient light as well as environments with little or no ambient light.

The speed at which a user may enter input into a physical keyboard may be increased as a user is not restricted to mechanically actuating a key by depressing each individual key. Instead, the user may slide an opaque object around the layer of keys to enter input. Thus, the physical keyboard supports gestures, sliding, and other movements along a horizontal plane of the keyboard. In addition, the use of the membrane on top of the keys to prevent moisture, particular matter, and the like from entering into the keyboard enables the keyboard to be used in environments where conventional keyboards would become damaged. For example, the keyboard described herein may be used in an industrial environment or even outdoors where moisture and/or particulate matter are present and may clog up a conventional mechanical keyboard.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A physical keyboard comprising:
   a plurality of light-sensing electrodes, wherein individual ones of the light-sensing electrodes of the plurality of light-sensing electrodes correspond to individual keys of the physical keyboard; and
   a microprocessor electrically coupled to individual ones of the light-sensing electrodes, the microprocessor configured to perform operation comprising:
      determining that light is obstructed to a first light-sensing electrode of the plurality of light-sensing electrodes for a predetermined period of time;
      measuring an amount of light received by the first light-sensing electrode after the light is obstructed;
      sending, based on the amount of light received by the first light-sensing electrode, a signal indicating a selection of a first key corresponding to the first light-sensing electrode;
      receiving data received from at least one ambient light sensor;
      determining, based on the data received from the at least one ambient light sensor, that an amount of ambient light falling on the physical keyboard is less than a predetermined threshold; and
      providing power to one or more light emitting diodes to illuminate the physical keyboard.

2. The physical keyboard of claim 1, wherein individual ones of the light-sensing electrodes measure an amount of light falling on individual ones of the light-sensing electrodes.

3. The physical keyboard of claim 1, wherein individual ones of the light-sensing electrodes comprise light dependent resistors having a resistance that varies between about 200 kilohms to about 10,000 kilohms.

4. The physical keyboard of claim 1, wherein keys of the keyboard are sealed inside a membrane to prevent moisture and particulate matter from entering into the physical keyboard.

5. The physical keyboard of claim 1, the microprocessor configured to perform operations further comprising:
   determining that the light is obstructed to a second light-sensing electrode of the plurality of light-sensing electrodes; and
   sending a second signal indicating a second selection of a second key corresponding to the second light-sensing electrode.

6. The physical keyboard of claim 5, wherein a stylus or a user's appendage slides from the first key to the second key.

7. The physical keyboard of claim 5, the microprocessor configured to perform operations further comprising:
   predicting a word based on the first key and the second key.

8. The physical keyboard of claim 1, wherein:
   a closed circuit is formed in response to light being present at individual keys of the keyboard; and
   the closed circuit transitions to an open circuit in response to light being obstructed to a particular light-sensing electrode corresponding to a particular key of the keyboard.

9. A computing device comprising:
   a housing comprising:
      an ambient light sensor;
      one or more processors;
      one or more non-transitory computer-readable storage media; and
      a keyboard, comprising:
         a plurality of light-sensing electrodes, wherein individual ones of the light-sensing electrodes of the plurality of light-sensing electrodes correspond to individual keys of the keyboard; and
         a microprocessor electrically coupled to individual ones of the light-sensing electrodes, the microprocessor configured to perform operations comprising:
            determining that light is obstructed to a first light-sensing electrode of the plurality of light-sensing electrodes for a predetermined period of time;
            measuring an amount of light received by the first light-sensing electrode after the light is obstructed;
            sending, based on the amount of light received by the first light-sensing electrode, a signal indicating a selection of a first key corresponding to the first light-sensing electrode;
            receiving data received from at least one ambient light sensor;
            determining, based on the data received from the ambient light sensor, that an amount of ambient light falling on the keyboard is less than a predetermined threshold; and
            providing power to the one or more light emitting diodes to illuminate the keyboard.

10. The computing device of claim 9, wherein the microprocessor is configured to perform operations further comprising:
    determining that the light is obstructed to a second light-sensing electrode of the plurality of light-sensing electrodes; and
    sending a second signal indicating a second selection of a second key corresponding to the second light-sensing electrode.

11. The computing device of claim 9, wherein:
    in a first state of the keyboard, one or more closed circuits are formed in response to light being present at individual keys of the keyboard; and
    in a second state of the keyboard, an open circuit is formed at an individual key of the keyboard in response to light being obstructed to a particular light-sensing electrode corresponding to the individual key of the keyboard for the predetermined period of time.

12. The computing device of claim 11, wherein the microprocessor is configured to perform operations further comprising:
   determining that the light is obstructed to a second particular light-sensing electrode of the plurality of light-sensing electrodes;
   sending a second signal indicating a second selection of a second key corresponding to the second particular light-sensing electrode; and
   predicting a word based on the first key and the second key.

13. The computing device of claim 9, further comprising:
   the plurality of light-sensing electrodes are disposed on a key matrix, wherein the plurality of light-sensing electrodes are mapped to a character map.

14. A computing device comprising:
   a housing comprising:
      one or more processors; and
      one or more non-transitory computer-readable storage media; and
   a keyboard communicatively coupled to the housing, the keyboard comprising:
      a plurality of light-sensing electrodes, wherein individual ones of the light-sensing electrodes of the plurality of light-sensing electrodes correspond to individual keys of the keyboard; and
      a microprocessor electrically coupled to individual ones of the light-sensing electrodes, the microprocessor configured to perform operations comprising:
         determining that light is obstructed to a first light-sensing electrode of the plurality of light-sensing electrodes for a predetermined period of time;
         measuring an amount of light received by the first light-sensing electrode after the light is obstructed;
         sending, based on the amount of light received by the first light-sensing electrode, a signal indicating a selection of a first key corresponding to the first light-sensing electrode;
         receiving data received from at least one ambient light sensor;
         determining, based on the data received from the at least one ambient light sensor, that an amount of ambient light falling on the keyboard is less than a predetermined threshold; and
         providing power to one or more light emitting diodes to illuminate the keyboard.

15. The computing device of claim 14, wherein individual ones of the light-sensing electrodes measure an amount of light falling on the individual light-sensing electrodes.

16. The computing device of claim 14, wherein a wired connection communicatively couples the keyboard to the housing.

17. The computing device of claim 14, wherein a wireless connection communicatively couples the keyboard to the housing.

18. The computing device of claim 14, wherein keys of the keyboard are sealed inside a membrane to prevent moisture and particulate matter from entering into the keyboard.

19. The computing device of claim 14, wherein the microprocessor is configured to perform operations further comprising:
   determining that the light is obstructed to a second light-sensing electrode of the plurality of light-sensing electrodes; and
   sending a second signal indicating a second selection of a second key corresponding to the second light-sensing electrode.

20. The computing device of claim 14, wherein:
   in a first state of the keyboard, one or more closed circuits are formed in response to light being present at individual keys of the keyboard; and
   in a second state of the keyboard, an open circuit is formed at an individual key of the keyboard in response to light being obstructed to a particular light-sensing electrode corresponding to the individual key of the keyboard for the predetermined period of time.

* * * * *